United States Patent [19]

Huber et al.

[11] 4,359,717
[45] Nov. 16, 1982

[54] POSITION-SENSITIVE ALARM SYSTEM

[75] Inventors: Bernd Huber, Altenberg; Erich Schneider, Kirchheim; Helmut Fleischer, Niddatal, all of Fed. Rep. of Germany

[73] Assignee: Robert Bosch GmbH, Stuttgart, Fed. Rep. of Germany

[21] Appl. No.: 121,575

[22] Filed: Feb. 14, 1980

[30] Foreign Application Priority Data

Mar. 31, 1979 [DE] Fed. Rep. of Germany ....... 2913018

[51] Int. Cl.³ .................... B60R 25/10; G08B 13/00
[52] U.S. Cl. ........................ 340/63; 340/65; 340/566; 340/669; 340/683; 73/DIG. 1; 73/493; 73/652; 73/654; 324/162; 200/61.45 R
[58] Field of Search ............. 340/63, 64, 65, 52 H, 340/541, 565, 566, 567, 665, 669, 683, 686, 870.31; 200/61.45 R, 61.52, 61.83; 73/570, 652, DIG. 1, 654, 493; 331/64, 65; 322/68, 91; 116/215; 324/257, 162; 336/75, 79

[56] References Cited

U.S. PATENT DOCUMENTS

| | | | |
|---|---|---|---|
| 2,890,438 | 6/1959 | Bardeen | 73/652 |
| 3,455,148 | 7/1969 | Foster et al. | 73/654 |
| 3,533,064 | 10/1970 | Perelman | 340/566 |
| 3,732,503 | 5/1973 | Rapp et al. | 331/65 |
| 3,973,191 | 8/1976 | Zabler | 340/870.31 |
| 4,013,986 | 3/1977 | Weckenmann | 340/870.31 |
| 4,057,791 | 11/1977 | Bimmerle et al. | 340/65 |
| 4,180,811 | 12/1979 | Yoshimura et al. | 340/566 |

FOREIGN PATENT DOCUMENTS 2357791 5/1975 Fed. Rep. of Germany ........ 340/63

*Primary Examiner*—Thomas A. Robinson
*Assistant Examiner*—Donnie L. Crosland
*Attorney, Agent, or Firm*—Frishauf, Holtz, Goodman & Woodward

[57] ABSTRACT

To increase the responsiveness of a vehicle alarm system to, for example, unauthorized entry through windows, jacking up for removal of parts or vehicle theft as well violent impact by another vehicle, at least one position sensitive sensor has its output signal, which represents the instantaneous position of the vehicle stored after activation of the alarm system. Any change in that position is detected and triggers a warning device when the deviation exceeds a predeterminable amount. The position sensitive sensor may be a fluid-filled vessel the internal resistance of which is measured in a resistance bridge or it may be a variable inductance sensor which is connected to a frequency generator whose output signals are counted and compared with a given value. The system according to the invention may also serve as an accelerometer.

18 Claims, 4 Drawing Figures

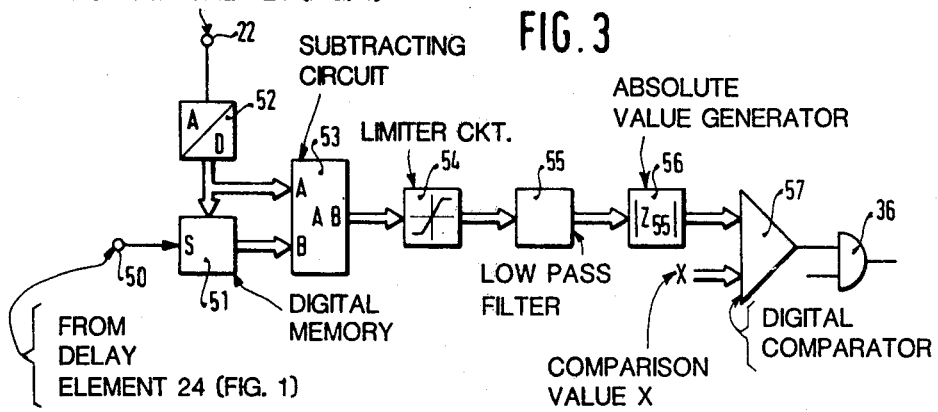
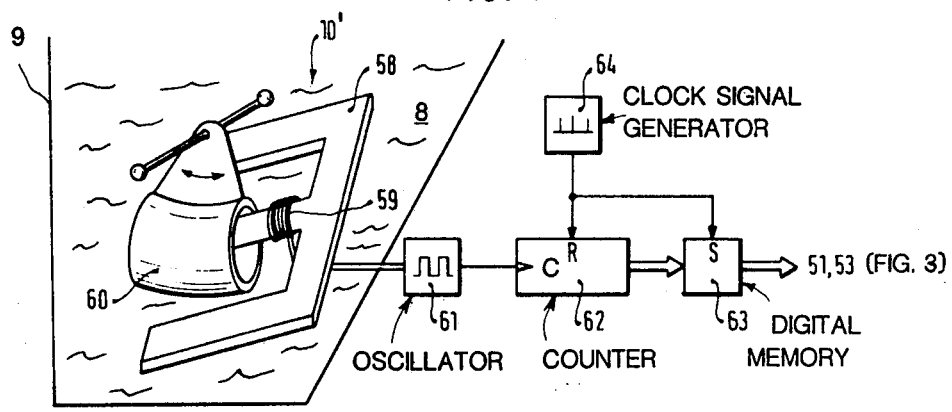

POSITION-SENSITIVE ALARM SYSTEM

FIELD OF THE INVENTION

The invention relates to alarm systems, especially for use in motor vehicles, to provide security against unauthorized entry and/or removal of the secured object. More particularly, the invention relates to an alarm system which detects a change in the spatial position of the secured object, i.e., a motor vehicle, and can be used to trigger an optical and/or acoustical alarm.

BACKGROUND AND PRIOR ART

An alarm system for securing a motor vehicle is known, for example, from U.S. Pat. No. 3,930,226. The system described there includes a signal generator which uses a door switch of the motor vehicle. After the activation of the alarm system described there, the alarm remains immune to triggering during an interval during which the driver may leave the vehicle and close the door. This known alarm system has the disadvantage that an alarm is triggered only when a door of the vehicle is actually opened. On the other hand, if the vehicle is entered by breaking a window, the alarm system does not respond nor does it respond, for example, to an impact due to another vehicle or to a physical removal of the entire vehicle.

THE INVENTION

It is thus a principal object of the present invention to provide an alarm system, especially for motor vehicles, which responds with a suitable alarm to any change of the position of the vehicle; and to provide an alarm not only in case of burglary and theft, but also upon damage due to, for example, being struck by another vehicle.

Briefly, in accordance with the invention, a given position signal is stored which is then compared with the instantaneous signal of the position sensor. This comparison may also serve to measure the acceleration of the vehicle in which the system is installed.

According to an advantageous feature of the invention, the position sensor is a fluid-filled container and contains no other mechanical parts. This provision results in great simplicity and avoids the use of expensive cables. According to another advantageous feature of the invention, the position sensor is a variable magnetic inductance which responds very precisely to any change in overall position. A further advantageous feature of the invention is the extensive or exclusive use of digital electronics to process the sensor information.

THE DRAWING

FIG. 3 is a schematic diagram of a portion of a second exemplary embodiment of the invention in a digital version; and FIG. 4 is a partial schematic diagram of an embodiment including an inductive position sensor.

DESCRIPTION OF THE PREFERRED EMBODIMENTS

Figure 1:
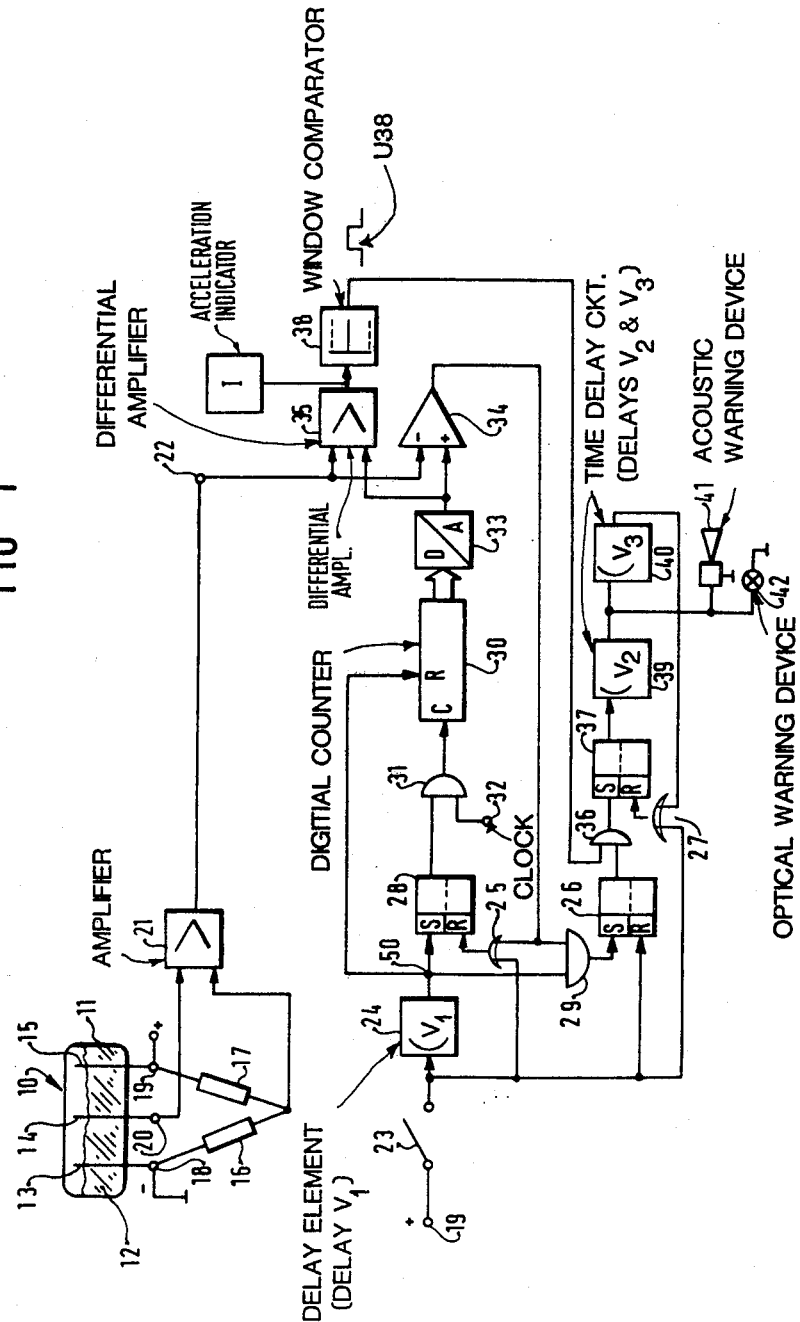
FIG. 1 is a schematic diagram of a first exemplary embodiment of the invention.

The first embodiment of the invention illustrated in FIG. 1 includes a position sensor 10 which has a container 11 which is partially filled with a suitable fluid 12. Passing into the liquid or fluid 12 are three rod electrodes 13, 14, 15 which are so located that an inclination of the position sensor 10 causes a varying length of rod to be wetted by the fluid. Depending on the inclination, i.e., depending on the degree of wetting, the ohmic resistance between two given electrodes changes. For example, if the position sensor 10 is tilted clockwise FIG. 1, the wetted part of the center electrode 14 remains the same the electrode 13 is wetted over a smaller length and the electrode 15 is wetted over a greater length. Accordingly, the effective resistance between the electrodes 13, 14 increases, and the effective resistance between the electrodes 14, 15 decreases. The variable resistors formed by the liquid or between the electrodes 13, 14 and 14, 15 are connected with two fixed resistors 16, 17 in a resistance bridge. The junction 18 of the electrode 13 and the resistor 16 is grounded while the junction 19 of the electrode 15 and the resistor 17 is connected to the positive pole of a suitable source of voltage, for example, the vehicle battery. The potential which is obtained across the point 20 connected to the center electrode and the junction of the resistors 16, 17, i.e., the voltage across the branches of the bridge, is fed to an amplifier 21 which applies an amplified bridge voltage signal to a circuit point 22.

In the simplest case, the position sensor 10 may include only two electrodes which define a single variable resistor which is connected with three fixed resistors in a resistance bridge circuit.

The circuit point 19 which receives the positive battery voltage is also connected via a main switch 23 (lower part of FIG. 1) to the input of a delay element 24, the input of an OR gate 25, the reset input of a flip-flop 26 as well as to one input of an OR gate 27. The delay element 24 applies a delay time $v_1$ to the rising edge of its input signal and its output is applied to the set input of a flip-flop 28 as well as to one input of an AND gate 29 and to the reset input of a digital counter 30. The output of the AND gate 29 is applied to the set input of the flip-flop 26 while the output of the flip-flop 28 is connected via an AND gate 31 to the clock input C of the counter 30. A suitable clock frequency is applied to the second input of the AND gate 31 via the terminal 32. The counter outputs of the digital counter 30 are applied to the digital inputs of a digital-analog converter 33 whose output is connected to one input of a comparator 34 and one input of a differential amplifier 35, both of which may be embodied as operational amplifiers. The output of the comparator 34 is connected through the OR gate 25 to the reset input of the flip-flop 28 as well as to a second input of the AND gate 29. The output of the flip-flop 26 is connected through an AND gate 36 to the set input of a further flip-flop 37. The output of the OR gate 27 is connected to the reset input of the flip-flop 37. The output of the differential amplifier 35 is connected through a window comparator 38 to the second input of the AND gate 36. The function of the window comparator 38 is to generate an output signal when its upper threshold is exceeded or its lower threshold is crossed downwardly. This window comparator may be embodied, for example, by the combination of two threshold switches whose outputs are coupled by an OR gate. The output of the flip-flop 37 is connected via the series connection of two time delay circuits 39, 40 to the second input of the OR gate 27. The delay circuit 39 delays the rising edge of an output signal from the flip-flop 37 by the time interval $v_2$ and the delay circuit 40 applies a delay $v_3$ to the rising edge of the output signal of the delay circuit 39. The output of the delay circuit 39 is connected to suitable inputs of an acoustic and an optical warning system 41, 42, respectively. The acoustic warning device 41 may be, for example, the horn of the vehicle while the optical warning device 42 may be, for example, the vehicle's headlights. The inputs to the various circuit components are dynamic inputs which respond to rising edges of their respective input signals. The reset inputs of the flip-flops 26-37 respond to decreasing signal edges. The circuit networks may be embodied by commercially available circuit elements which already exhibit dynamic inputs or common RC input circuits can be connected ahead of the various circuit elements. Operation, with reference to FIG. 2:

When the main switch 23 is closed, a signal U23 (FIG. 2) is applied to the input of the delay circuit 24 whose output appears as a signal U24 after a delay $v_1$. The rising edge of the signal U23 resets the flip-flops 28,26, and 37. The rising edge of the signal U24 resets the counter 30 and sets the flip-flop 28 which therefore produces an output signal U28 which causes the AND gate 31 to permit the passage of the clock signal which is present at the point 32. The clock signal is now counted upwardly in the counter 30 so that an increasing voltage U33 appears at the output of the digital-analog converter 33. The voltage U33 increases until it reaches a value equal to the amplified bridge voltage U22 of the bridge circuit 13-17. The amplified bridge voltage U22 is applied to one input of the comparator 34. Whenever the voltages at the two inputs of the comparator 34 are equal, an output signal is produced which passes the OR gate 25 and resets the flip-flop 28 while the flip-flop 26 is set via the AND gate 29. When the flip-flop 28 is reset, the counter 30 stops counting and its contents are stored so that the output voltage U33 from the digital-analog converter 33 is constant. It is the purpose of the delay circuit 24 to give the motor vehicle operator an opportunity to activate the alarm system and thereafter to leave the vehicle before the instantaneous position of the vehicle is stored for future reference. This delay is necessary because the relative position of the vehicle changes somewhat when the driver exits from the vehicle. The delay $v_1$ may be, for example, equal to two minutes. After the expiration of the delay $v_1$, the prevailing position of the vehicle is stored.

Figure 2:
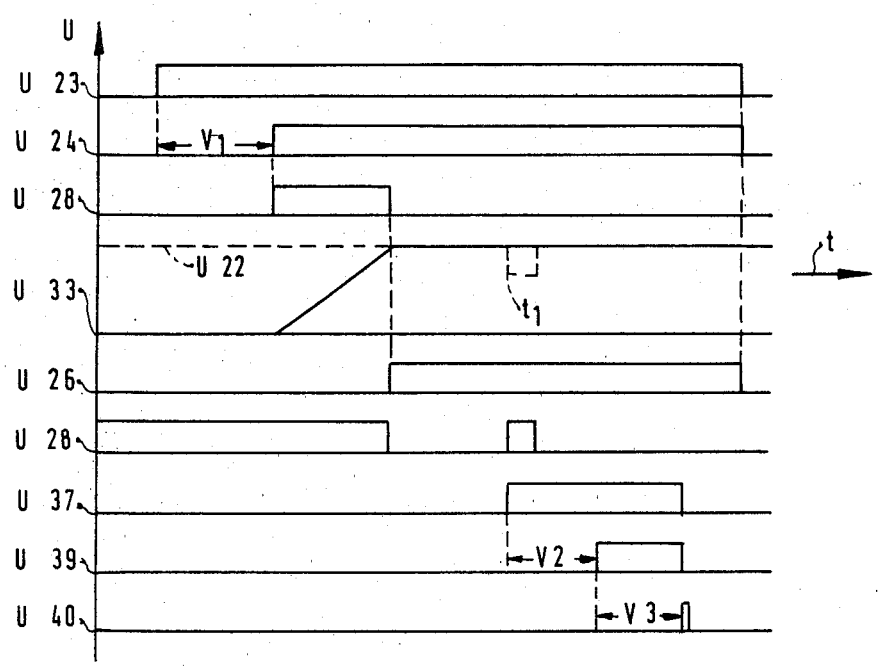
FIG. 2 is a timing diagram to illustrate the function of the apparatus of FIG. 1.

At any point thereafter, a change in the relative position of the position sensor 10, for example, due to unauthorized entry into the vehicle, an impact by some other vehicle or still other causes, changes the inclination of the position sensor 10 and hence the relative inclination of the fluid level of the fluid 12. Accordingly, the bridge voltage changes as does the signal U22 as indicated in FIG. 2 for the time $t_1$. When this change is large enough so as to cross one of the two thresholds of the window comparator 38, a signal U38 (FIG. 1) is generated and sets the flip-flop 37 after passage through the AND gate 36. The signal U38 was also generated during the storing of the reference position in the counter 30. However, at that time the flip-flop 37 could not yet be set because the AND gate 36 was blocked by the presence of a logical 0 signal at the output of the flip-flop 26. The signal U37 now present at the output of the flip-flop 37 is delayed by the delay circuit 31 by an amount $v_2$. The signal U39, which occurs at the expiration of the delay time $v_2$, triggers the alarm systems 41, 42. The rising edge of the signal U39 is delayed by the delay circuit 40 and by an amount equal to $v_3$ whereafter a signal U40 is generated which resets the flip-flop 37. The delay $v_3$ provided by the delay circuit 40 defines the length of time during which the alarm sounds, and this time is legally limited in many jurisdictions. The purpose of the timing delay 39 is to give an authorized party the opportunity to enter the vehicle, and to turn off the alarm system by opening the switch 23 and resetting the flip-flops 28, 26, 37. A suitable time for the delay $v_2$ is, for example, 15 seconds.

If it is desired to obtain an intermittent warning signal, the alarm systems 41, 42 may be actuated by the insertion of a suitable oscillator triggered by the signal U39.

The sensitivity of the alarm system as described above may be adjusted by setting the threshold of the window comparator 38. However, the sensitivity must not be so great as to cause an activation of the alarm system by external influences, for example, a passing truck, a strong wind or the motions imparted to the vehicle, for example, by playing children.

The reliability of the system may be improved, for example, by the disposition of two position sensors 10 at right angles to one another which insures that any and all changes in the installation of the vehicle can be recognized. In such a case, the data storage elements, or at least the comparator 34 and the differential amplifier 35, must be present in tandem and their outputs must be joined. Correspondingly, the elements 51-53 and all of the elements of the embodiment of FIG. 4 would have to be provided in duplicate.

The output signal of the differential amplifier 35 may also be used to measure the acceleration of the vehicle in which the system is installed. For this purpose, the main switch 23 may be turned on and off for a short period of time prior to starting the vehicle so as to cause storage of the instantaneous inclination of the vehicle in the counter 23 but without causing the alarm system to be triggered. Any changes of the fluid level 12 due to acceleration causes a proportional signal to be generated at the output of the differential amplifier 35 and this signal may be displayed on a suitable instrument.

A second embodiment of the invention, illustrated in FIG. 3 provides for a largely digital processing of the data obtained. Terminal 50 which is coupled to the output of the delay circuit 24 of FIG. 1 is connected to the set input S of a digital memory 51 which may be either a random access memory (RAM) or a digital terminal. The counter 22 is connected to the input of an analog-digital converter 52 whose digital outputs are coupled to the digital inputs of the memory 51 as well as to the inputs A of a subtracting circuit 53. The digital outputs of the memory 51 are connected to the inputs B of the subtracting circuit 53. The digital outputs A-B are connected to the inputs of a limiting circuit 54 whose output is coupled via a low pass filter 55 and an absolute value generator 56 to the first input of a digital comparator 57 whose secondary comparison inputs are preferably hard-wired to receive a comparison value X. The output of the comparator 57 is connected to one input of the AND gate 36 as shown in FIG. 1. The remainder of the circuit of FIG. 3 may be identical to that of FIG. 1 except for the absence of the circuit elements 25, 28-34. The terminal 50 is connected directly to the set input of the flip-flop 26. Conversely, the signal limiting circuit 54 and the filter 55 may also be provided in the first exemplary embodiment of FIG. 1, for example, behind the differential amplifier 35.

Operation, circuit of FIG. 3:

Memory 51 stores a digital value which corresponds to the bridge voltage of the bridge circuit 13-17 at the occurrence of the rising edge of the signal U24. At this instant, the digital data at the points A and B are equal so that the output of the subtracting circuit 53 exhibits the value 0. If the position of the vehicle and hence of the sensor 10 is changed, the digital input at the inputs A of the subtracting circuit 53 changes and the magnitude of this difference is passed through the circuit elements 54-56 and is applied to the comparator 57 where it is compared with the fixed value X. If the limited and filtered deviation A-B exceeds the value X, an output signal is generated in the manner described with reference to the first embodiment of FIG. 1. If this output signal is sustained for a given period of time, it triggers an alarm via the AND gate 36. However, if this signal is very short, it is suppressed by the low pass filter 55. Very short term signals, for example those induced by the play of children or by bursts of air, are not intended to trigger an alarm. The limiting circuit 54 may be, for example, an intermediate digital memory or counter whose capacity is limited and which thus ignores higher stored values. Its purpose is to prevent the triggering of an alarm when the vehicle is shaken very strongly. On the other hand, small but long-term signals should trigger the alarm, for example signals occurring when the vehicle is raised to remove the wheels. If for some reason the alarm system is intended to be triggered even during short-term position changes, the limiting and filtering elements may be omitted.

A different embodiment of the position sensor for use in the invention is illustrated in FIG. 4. In this embodiment, the position sensor 10' is a short-circuit ring sensor, for example as described in the German patent disclosure document 2 352 851, to which U.S. Pat. No. 4,013,986, Weckenmann, corresponds which may be combined with an oscillator and such as described in the German disclosure document DE-OS 2 357 791 Zabler and DE-OS 2 416 237 to which U.S. Pat. No. 3,973,191, Zabler, corresponds, all assigned to the assignee of this application. As adapted for the present case, the short-circuit sensor consists of a three-legged core 58, the center leg of which carries a magnetic coil 59. A short curved tube 60 is attached to a pivotable shaft and tends to maintain its position in space due to gravity. The vehicle to be secured is rigidly coupled to the magnetic core 58 which thus enters the tube 60 to varying degrees when its inclination changes. The pivoting of the tube shaft should be frictionless so as to be sensitive to even very small changes in angle. The entire sensor 10 may be immersed in a silicone damping fluid 8 as schematically shown by the outline 9 of a retaining vessel so as to prevent excessive pivoting of the short-circuit ring 60 when the vehicle is subject to large changes of motion. Excessive relative motions of the short-circuit sensor with respect to the core 58 would cause it to oscillate in the non-linear domain of sensitivity. The two ends of the coil 59 are connected to an oscillator 61. The output frequency of the oscillator 61 is a function of the inductance of the coil 59 which in turn changes in dependence on the relative position of the ring 60 and the core 58. The output of the oscillator 61 is connected to the clock input of a counter 62 whose digital outputs are fed to a memory 63. The output of a clock signal generator 64 is applied to the reset input of the counter 64 as well as to the set input of the memory 63. The digital outputs of the memory 63 are fed to the memory 51 as well as to the subtracting circuit 53 illustrated in FIG. 3. In this embodiment, the analog-digital converter 52 may be omitted because the position-dependent datum is already in digital form.

Operation of system of FIG. 4: The changes in position of the vehicle and hence of the core 58 change the inductance of the core 58 and thus the frequency of the signal generator 61. The output signals of the frequency generator 61 are counted in the counter 62 until such time as the clock generator 64 generates a reset signal. At this time, the counting process begins anew. Just prior to the occurrence of a reset signal, the contents of the counter 62 are transferred to the memory 63 which may be accomplished, for example, by slightly delaying the reset signal. The memory 63 thus always contains an actual position-dependent signal.

The sensor system of FIG. 4 may also be used in the embodiment of FIG. 1. In this case, the digital-analog converter 33 is omitted, and the comparator 34 is embodied as a digital comparator, as is the window comparator 38.

The digital circuitry of the embodiments described above may also be realized advantageously by use of a microprocessor.

It may be desired to take account of the possibility that the position of the vehicle may change over a long period of time, for example due to melting snow on the road surface on which the vehicle is standing. In order to provide for suppression of the alarm and a renormalization of the system to account for the changed position over long periods of time, the signal U24 at the terminal 50 may be used to control a timing circuit having a time constant of, for example, an hour. This timing circuit may be used to store a new nominal value of the prevailing vehicle position.

It is also possible to use a digital delay system of first order to adjust the reference value to the actual value periodically, for example every hour.

The preferred exemplary embodiments of the invention described above are subject to various changes and modifications, in particular to the combination of features of one embodiment with one or more features of another embodiment as well as to changes within the general competence of a person skilled in the art without departing from the scope of the invention.

We claim:

1. A vehicle alarm system adapted for installation in a vehicle having
   a warning device (41, 42) triggerable upon detection of a disturbance to the vehicle and
   comprising
   at least one position sensitive sensor (10, 10') furnishing repetitively, continuously sequentially position output signals representative of the position of the vehicle on a support surface;
   data storage means (30, 51) connected to and receiving the position output signals from said sensor, and storing data representative of the position of the vehicle on the support surface;
   comparator means (34, 53) connected to said data storage means and said position sensitive sensor and receiving stored data indicative of a prior position of the vehicle as represented by a prior position output signal as well as a then furnished position output signal, and comparing said prior and then furnished signals for detecting a deviation of the position output signal furnished by said sensor

(10) from a stored value retained in the storage means, said comparator means furnishing a triggering signal to said warning device (41, 42) when said deviation of position exceeds a predetermined amount to provide a warning when a disturbance of the position of the vehicle with respect to a prior position on said support surface is sensed by said sensor.

2. Alarm system according to claim 1, wherein said position sensitive sensor (10) comprises
 a vessel (11) at least partially filled with an electricity conducting liquid (12);
 at least two electrodes (13, 14, 15) immersed in said liquid;
 and means (16-21) connected to the at least two electrodes responsive to the resistance between said at least two electrodes as determined by the relative orientation of the fluid level in said vessel for furnishing a signal representative of the position of the vehicle with respect to the support.

3. Alarm system according to claim 2, wherein three electrodes (13, 14, 15) are provided, the conductive path between a first electrode (14) and a second electrode (13) constituting a first variable resistance;
 and the conductive path between said first electrode (14) and the third electrode (15) constituting a second variable resistance.

4. Alarm system according to claim 2, wherein said position signal furnishing means comprises a resistance measuring bridge circuit (16-20) in which said at least two electrodes are connected, said bridge circuits being connected to said data storage means (30, 51) to store in said data storage means signals representative of the voltage across the bridge circuit.

5. Alarm system according to claim 1, wherein said position sensitive sensor (10') comprises
 an electromagnetic sensor (58-60) having a magnetic core (58) rigidly attached to said vehicle;
 at least one inductive coil carried on said core;
 means energizing said coil;
 means controlling the electromagnetic induction of the coil as a function of the position of the vehicle;
 and means connected to said coil furnishing the position output signal as a function of the inductance of the coil and hence of the orientation of the vehicle with respect to the support.

6. Alarm system according to claim 5, wherein said core (58) has a trident configuration, the coil is located on the center tine of the trident;
 and a short-circuiting ring (60) is provided movable around the coil on the central one of the tines of the trident.

7. Alarm system according to claim 5, wherein at least a portion of the sensor (10') is immersed in a damping medium (8).

8. Alarm system according to claim 5, further including
 a frequency generator (61) connected to the coil (59), the frequency of said generator being determined by the inductance of the coil;
 said data storage means comprises a counter (62) and a digital memory (63) connected thereto; and
 means (64) cyclically transferring signals representative of the frequency of said frequency generator (61) into said counter and into said memory in cyclical intervals to thereby store a position-dependent value in said memory for comparison with a subsequent position-dependent value.

9. An alarm system according to claim 1, wherein said data storage means comprises
 a digital counter (30);
 a clock source (32);
 starting means (23, 24, 28, 31) connected to said counter and controlling transfer of clock pulses to said counter, said counter continuing to count until it reaches a value representative of the output position signal to thereby store a value representative of the then existing position of the vehicle with respect to the support as a count number in said counter.

10. An alarm system according to claim 1, wherein said data storage means comprises
 a digital memory (51);
 and connection means (22, 52) interconnecting said digital memory and said sensor (10, 10') to receive and store a signal in said digital memory representative of a sensed position of the vehicle with respect to the support.

11. An alarm system according to claim 1, further including starting circuit means (19, 23) connected to the system to activate or set or arm said system;
 and delay means (24) connected between said starting means and said system for delaying starting, activation or arming of said system for a predetermined time interval ($v_1$) after activation of said starting means.

12. An alarm system according to claim 1, further including output delay means connected in advance of said warning device (41, 42) to delay activation of said warning device even though said comparator means has furnished said trigger signal.

13. An alarm system according to claim 1, further including a clock generator (64) for generating signals causing cyclical repetition and storage of the position output signals.

14. An alarm system according to claim 1, further including acceleration indicator means (I) connected to the output of the comparator means, said acceleration indicator means providing an output indicative of the deviation of stored position at a given time with respect to a previously stored position at a prior time and hence, upon repetitive outputs, providing an indication of the rate of change of position, with respect to time.

15. An alarm system according to claim 1, wherein said discriminator means includes at least threshold detector (38, 57) for determining said deviation of the sensor output signals from the stored value.

16. An alarm system according to claim 1, further including filter means (55) for determining the predetermined amount by which the output signal of said sensor (10) must deviate from said stored value prior to triggering said warning device.

17. An alarm system according to claim 1, further comprising signal limiter means (54) for limiting the deviation of the output signal of said sensor (10) from the stored value.

18. An alarm system according to claim 1, wherein said signal generator means includes two position sensitive sensors responsive to position changes along perpendicular geometric axes.

* * * * *